United States Patent
Kadota

(10) Patent No.: US 7,183,953 B2
(45) Date of Patent: Feb. 27, 2007

(54) CALIBRATING AUTOMATIC TEST EQUIPMENT CONTAINING INTERLEAVED ANALOG-TO-DIGITAL CONVERTERS

(75) Inventor: Toshihide Kadota, Poway, CA (US)

(73) Assignee: Teradyne, Inc., North Reading, MA (US)

(*) Notice: Subject to any disclaimer, the term of this patent is extended or adjusted under 35 U.S.C. 154(b) by 0 days.

(21) Appl. No.: 11/094,896

(22) Filed: Mar. 31, 2005

(65) Prior Publication Data
US 2006/0227026 A1 Oct. 12, 2006

(51) Int. Cl.
*H03M 1/10* (2006.01)

(52) U.S. Cl. ............... 341/120; 341/118; 341/141; 341/155

(58) Field of Classification Search ............... 341/118, 341/120, 141, 155
See application file for complete search history.

(56) References Cited

U.S. PATENT DOCUMENTS

| | | | | |
|---|---|---|---|---|
| 4,345,241 A | * | 8/1982 | Takeuchi et al. ............ | 341/118 |
| 4,736,189 A | * | 4/1988 | Katsumata et al. ......... | 341/120 |
| 4,763,105 A | * | 8/1988 | Jenq ........................... | 341/120 |
| 4,962,380 A | * | 10/1990 | Meadows ................... | 341/120 |
| 4,968,988 A | * | 11/1990 | Miki et al. .................. | 341/141 |
| 5,202,686 A | * | 4/1993 | Rapp et al. ................. | 341/139 |
| 5,239,299 A | * | 8/1993 | Apple et al. ................ | 341/118 |
| 5,294,926 A | * | 3/1994 | Corcoran .................... | 341/120 |
| 6,269,317 B1 | * | 7/2001 | Schachner et al. .......... | 702/91 |
| 6,384,756 B1 | * | 5/2002 | Tajiri et al. ................. | 341/120 |
| 6,445,319 B1 | * | 9/2002 | Bugeja ....................... | 341/138 |
| 6,452,518 B1 | * | 9/2002 | Kawabata ................... | 341/118 |
| 6,522,282 B1 | * | 2/2003 | Elbornsson ................. | 341/155 |
| 6,556,156 B1 | * | 4/2003 | Hungerbuehler ........... | 341/120 |
| 6,700,515 B2 | * | 3/2004 | Asami ......................... | 341/120 |
| 2002/0122503 A1 | * | 9/2002 | Agazzi ........................ | 375/316 |

OTHER PUBLICATIONS

"Advanced Digital Post-Processing Techniques Enhance Performance in Time-Interleaved ADC Systems", URL http://www.analog.com/analogdialogue, Analog Dialogue 37-8, Aug. 2003, 5 pgs.

* cited by examiner

*Primary Examiner*—Rexford Barnie
*Assistant Examiner*—Khai Nguyen
(74) *Attorney, Agent, or Firm*—Fish & Richardson P.C.

(57) ABSTRACT

Automatic test equipment (ATE) includes interleaved analog-to-digital (A2D) converters to produce digital signals, where the digital signals are used to produce an output signal, the output signal having spurs, a look-up table (LUT) to store correction values, where the correction values are for reducing the spurs in the output signal, and circuitry to apply the correction values to the output signal.

27 Claims, 4 Drawing Sheets

CALIBRATING AUTOMATIC TEST EQUIPMENT CONTAINING INTERLEAVED ANALOG-TO-DIGITAL CONVERTERS

TECHNICAL FIELD

This patent application relates generally to calibrating automatic test equipment (ATE) containing interleaved analog-to-digital (A2D) converters. More particularly, the application relates to generating correction values for use in reducing spurs in output signals produced by combining outputs of the interleaved A2D converters.

BACKGROUND

ATE refers to an automated, usually computer-driven, approach to testing devices, such as semiconductors, electronic circuits, and printed circuit board assemblies. A device tested by ATE is referred to as a device under test (DUT).

ATE typically includes interleaved A2D converters, which are used to convert analog signals to digital format. Interleaving is a technique for increasing the bandwidth and sampling frequency of A2D converters. For example, two A2D converters may be used to sample the same signal at different times, and to produce two digital signals as a result. These digital signals may be used to produce an output signal that has an effective sampling frequency that is two times the sampling frequency of each individual A2D converter.

However, problems can result from interleaving. In particular, mismatches between analog and digital channels of the interleaved A2D converters can result in dynamic range degradation. In a fast Fourier transform (FFT) plot, this degradation shows up as spurious frequency components, or "spurs". Two types of spurs can occur.

Image spurs are a result of gain and phase mismatches between analog and digital channels of interleaved A2D converters. Gain and phase errors produce error functions that are orthogonal to one another and that contribute to image spur energy at a particular frequency. Offset spurs are a result of offset differences between analog and digital channels of interleaved A2D converters. For a given offset mismatch, offset spurs are always at a same level. Offset spurs have a direct impact on spurious-free dynamic range (SFDR), and thus degrade a receiver's sensitivity.

SUMMARY

This patent application describes methods and apparatus, including computer program products, for calibrating ATEs.

In general, in one aspect, the invention is directed to ATE that includes interleaved A2D converters to produce digital signals, where the digital signals are used to produce an output signal having spurs, a look-up table (LUT) to store correction values for reducing the spurs in the output signal, and circuitry to apply the correction values to the output signal. This aspect may also include one or more of the following.

The spurs may include at least one of image spurs and offset spurs, and the correction factors may substantially negate at least some of the spurs. A buffer may receive the digital signals and may provide the output signal to the circuitry. The interleaved A2D converters may include at least a first A2D converter and a second A2D converter. The first A2D converter may produce a first digital signal and may output the first digital signal to the buffer, and the second A2D converter may produce a second digital signal and may output the second digital signal to the buffer. The first A2D converter and the second A2D converter may sample an input analog signal at different times to produce the first digital signal and the second digital signal, respectively.

The ATE may include programmable logic. The LUT and the circuitry may be part of the programmable logic. The circuitry may be an element to combine the correction values and the output signal. The circuitry may apply the correction values to the output signal to produce a corrected output signal. The ATE may include a digital signal processor that receives the corrected output signal.

In general, in another aspect, the invention is directed to a system for calibrating ATE. The system includes a processing device to provide a first digital signal, a waveform generator to generate a first analog signal, where the first analog signal is based on the first digital signal, and interleaved A2D converters to receive a second analog signal, where the second analog signal is based on the first analog signal. The interleaved A2D converters produce second digital signals, where the second digital signals are used to produce an output signal that is digital. The ATE includes programmable logic to store a LUT. The processing device is configured to receive a third digital signal that corresponds to the output signal, to generate correction values based on the third digital signal, and to store the correction values in the LUT. This aspect may also include one or more of the following.

The processing device may generate the correction values by comparing the third digital signal to the first digital signal, where the correction values correspond to a difference between the third digital signal and the first digital signal. The waveform generator may include at least one D2A converter and a bandpass filter that are used in producing the analog signal from the first digital signal. The output signal may contain spurs, and the correction values may be used to reduce spurs in future output signals that are based on outputs of the interleaved A2D converters. The interleaved A2D converters may include at least a first A2D converter and a second A2D converter. The first A2D converter may be for producing one digital signal by sampling the second analog signal at one time, and the second A2D converter may be for producing an other digital signal by sampling the second analog signal at another time. The one digital signal and the other digital signal may include the second digital signals. The second analog signal may include one of plural multi-tones, where the multi-tones are across a frequency range of the interleaved A2D converters. The multi-tones may be phase-aligned or phase-misaligned.

In general, in another aspect, the invention is directed to a method of calibrating ATE. The method includes providing a first digital signal; generating a first analog signal based on the first digital signal; receiving, at interleaved A2D converters, a second analog signal, where the second analog signal is based on the first analog signal; outputting, from the interleaved A2D converters, second digital signals, where the second digital signals are used to produce an output signal that is digital; generating correction values based on a third digital signal, where the third digital signal corresponds to the output signal; and using the correction values to adjust a future output signal that is based on outputs of the interleaved A2D converters. This aspect may also include one or more of the following.

Generating the correction values may include comparing the third digital signal to the first digital signal. The correction values may correspond to a difference between the third digital signal and the first digital signal. The second analog signal may include one of plural multi-tones. The multi-tones may be across a frequency range of the interleaved A2D converters. The multi-tones may be phase-aligned or phase-misaligned. Using the correction values to adjust the future output signal may include combining the correction values with the future output signal to reduce spurs in the future output signal.

The details of one or more examples are set forth in the accompanying drawings and the description below. Further features, aspects, and advantages of the invention will become apparent from the description, the drawings, and the claims.

DESCRIPTION OF THE DRAWINGS

Like reference numerals in different figures indicate like elements.

DETAILED DESCRIPTION

Figure 1:
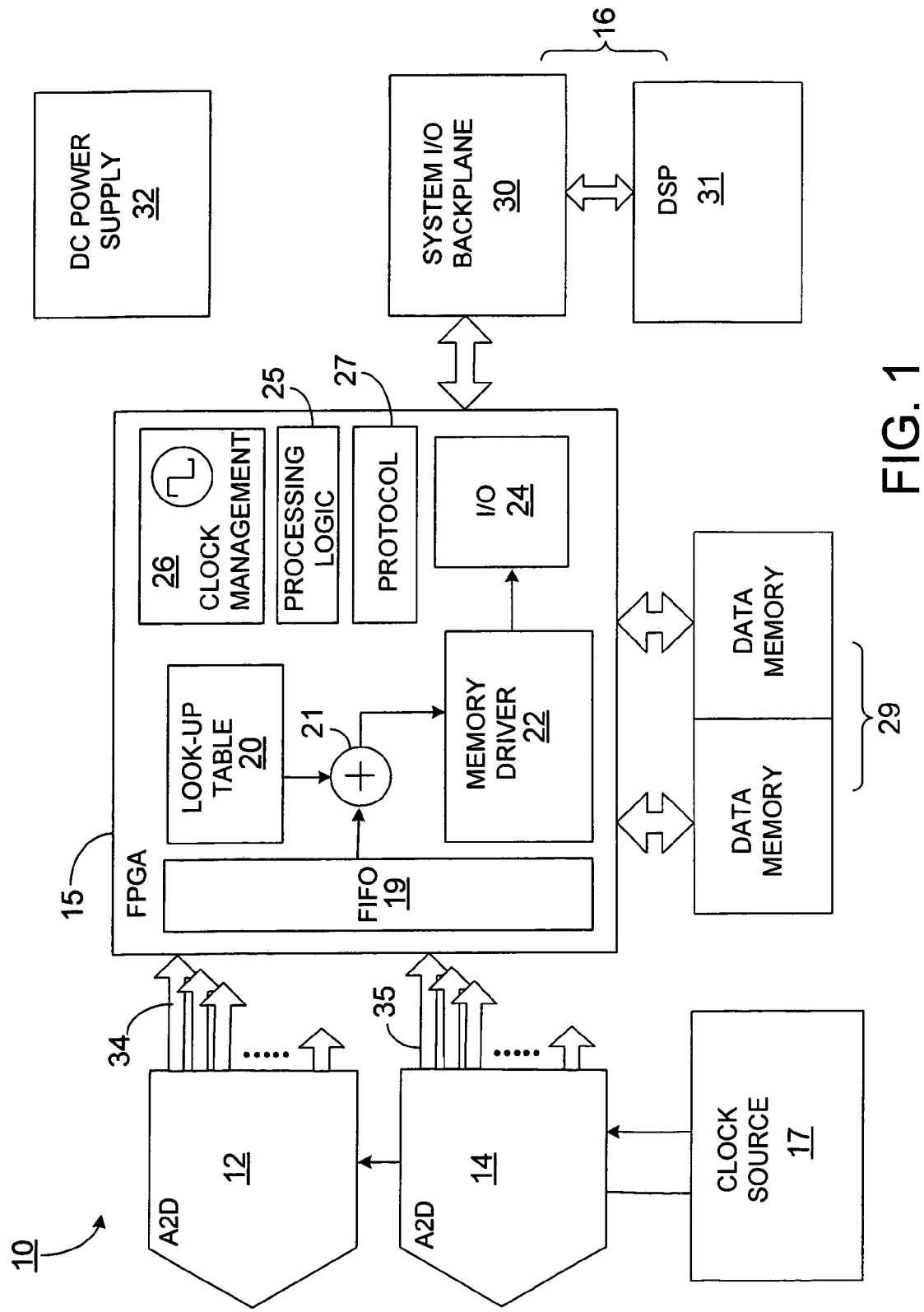
FIG. 1 is a block diagram of an interleaved A2D converter system that stores correction values for use in reducing output signal spurs.

FIG. 1 shows circuitry 10 that is part of an ATE. Circuitry 10 includes two interleaved A2D converters 12 and 14, field-programmable gate array (FPGA) 15, and test system 16. A clock source 17 provides a clock signal to A2D converters 12 and 14.

FPGA 15 contains programmable logic to implement a first-in-first-out (FIFO) buffer 19, a look-up table (LUT) 20, arithmetic logic circuitry 21, a memory driver 22, and input/output (I/O) logic 24. The operation of these circuit elements is described below. FPGA 15 may also implement additional circuitry, such as processing logic (CPU) 25, clock management circuit 26, and protocol conversion circuit 27. Memory 29 is used by FPGA 15 to store data, including corrected output signals from A2D converters 12 and 14. The output signals are corrected, as described below, to reduce spurs.

Referring to FIG. 1, test system 16 includes a backplane 30 and a digital signal processor (DSP) 31. Backplane 30 transmits signals between FPGA 15 and DSP 31. DSP 31 receives signals from FPGA 15, including corrected output signals, and processes these signals to obtain test results from a DUT or other circuitry that provides an analog signal to the interleaved A2D converters. A power supply 32 may be used to provide power to FPGA 15, backplane 30, and/or any other circuitry shown in FIG. 1.

In operation, interleaved A2D converters 12 and 14 sample an analog signal and generate corresponding digital signals 34 and 35, respectively. The analog signal may originate at a DUT or other device. Each A2D converter operates off a reference clock provided by clock source 17, and out of phase from its counterpart. For example, A2D converter 12 may be 180° out of phase from A2D converter 14. Thus, A2D converter 12 samples the analog signal at one time, and A2D converter 14 samples the analog signal at another time. Resulting digital signals 34 and 35 are combined to approximate an A2D converter having twice the sampling frequency of each A2D converter 12, 14.

More specifically, A2D converters 12 and 14 output digital signals 34 and 35 to FIFO buffer 19. Demultiplexers (not shown in FIG. 1) may be used to output the data to FIFO buffer 19. The data may be provided, in parallel, to FIFO buffer 19 for processing.

Gain and phase mismatches of the analog and digital channels of A2D converters 12 and 14, and offset differences thereof, cause image and offset spurs in an output signal from the A2D converter(s). In this regard, studies have produced mathematical formulae that characterize the relationship between spur level and channel matching. A simplified "error voltage" approach provides a way of understanding such relationships. The error voltage is the difference between an expected sample voltage and an actual sample voltage at a spur.

In a two-A2D interleaved converter system, error voltages generated by gain and phase mismatches result in an image-spur at a frequency that corresponds to the system's Nyquist frequency minus its analog signal input frequency. An offset mismatch generates an error voltage that results in an offset spur at the system's Nyquist frequency. In a four-A2D interleaved converter system, there are three image spurs and two offset spurs. The image spurs, in this case, are at a frequency that corresponds to the Nyquist frequency minus the analog signal input frequency, and at frequencies that corresponds to one-half the Nyquist frequency plus and minus the analog signal input frequency. The offset spurs are at the Nyquist frequency and at one-half of the Nyquist frequency, i.e., at the middle of the frequency band. Interleaved converter systems with more than four A2D converters, e.g., eight, sixteen, etc., include additional image and offset spurs.

Heretofore, problems associated with spurs in the output signal were addressed solely in DSP 31. That is, DSP 31 executed a complex set of routines to eliminate or to reduce spurs in the output signal. This approach, however, is relatively time-consuming and can require a significant amount of DSP resources. The circuitry of FIG. 1, by contrast, uses LUT 20 and arithmetic logic circuitry 21 to eliminate, or to reduce, spurs in the output signal before the output signal reaches DSP 31. As a result, the amount of time and resources that DSP 31 needs to dedicate to processing the output signal is reduced, thereby reducing overall testing time.

In more detail, LUT 20 stores correction values for use with the output signal from FIFO buffer 19—hereinafter referred to as "the output signal". These correction values are used to correct both image spurs and offset spurs in the output signal. The correction values are obtained, and stored in LUT 20, via the calibration process of FIG. 2 (below).

During ATE operation, arithmetic logic circuitry 21 applies the correction values to the output signal before the output signal is provided to DSP 31. The correction values may be based on the sampling frequencies of A2D converters 12 and 14. That is, different correction values will apply to different sampling frequencies. Thus, when the sampling frequency changes, the correction values in the LUT may also need to be changed. Arithmetic logic circuitry 21 and/or processing logic 15 obtains a current sampling frequency, e.g., from FIFO 19, from A2D converters 12 and 14, or from some other source, and uses this sampling frequency to retrieve the appropriate correction factors from LUT 20. To increase operational speed, the A2D converters are sampled sequentially, but the results are processed in parallel.

In one embodiment, arithmetic logic circuitry 21 includes an adder, which adds the correction values to the output signal. In other embodiments, different arithmetic logic, e.g., subtractor(s), multiplier(s), etc., may be used to combine the correction values and the output signal. In embodiments where there are more than two interleaved A2D converters, processing logic 15 may correlate the correction values with the output signal. That is, the appropriate correction values from LUT 20 are applied to the output signal at appropriate demultiplexed logical pins over time in order to correct mismatches.

Arithmetic logic circuitry 21 passes a corrected, digital output signal to memory driver 22, which stores the output signal in memory 29. From there, the output signal may be read and passed, via I/O logic 24, to backplane 30 and DSP 31. DSP 31 may perform any type of processing on the output signal. Such post processing may, or may not, include executing additional routines to reduce spurs in the output signal even further.

In the embodiment of FIG. 1, A2D converters 12 and 14 are 0 to 2 gigahertz (GHz), 10-bit, converters that sample at 2 giga-samples per second (Gsps) with 1:8 demultiplexer capability at 250 megabits per second (Mbps). Clock source 17 provides a 2 GHz reference clock signal. It is noted that the invention is not limited to A2D converters of this type, and that any number and type of interleaved A2D converters may be used.

In this regard, although only two A2D converters are shown in FIG. 1, any number of interleaved A2D converters may be used, e.g., four interleaved A2D converters, eight interleaved A2D converters, sixteen interleaved A2D converters, etc. As explained above, interleaved A2D converters store digital signals in FIFO buffer 19 as they are obtained, e.g., first from A2D converter 12, then from A2D converter 14. In cases where there are more than two interleaved A2D converters, this process progresses similarly, e.g., first from $A2D_1$, then from $A2D_2$, then from $A2D_3$, then from $A2D_4$, and so on.

Mismatches between A2D converters in a series of interleaved A2D converters will result in the spurs noted above. For example, mismatches between $A2D_1$ and $A2D_2$ will result in spurs, mismatches between $A2D_2$ and $A2D_3$ will result in spurs, and so on. The appropriate correction values from LUT 20 thus must be applied to the output signal at the appropriate time in order to correct for the mismatches. Processing logic 15 and/or arithmetic logic circuitry 22, are thus configured to apply appropriate correction values from LUT 20 at appropriate points in the output signal. For example, relevant information, such as the number of A2D converters being used and their sampling frequencies, may be pre-programmed into FPGA 15 by DSP 31.

Figure 2:
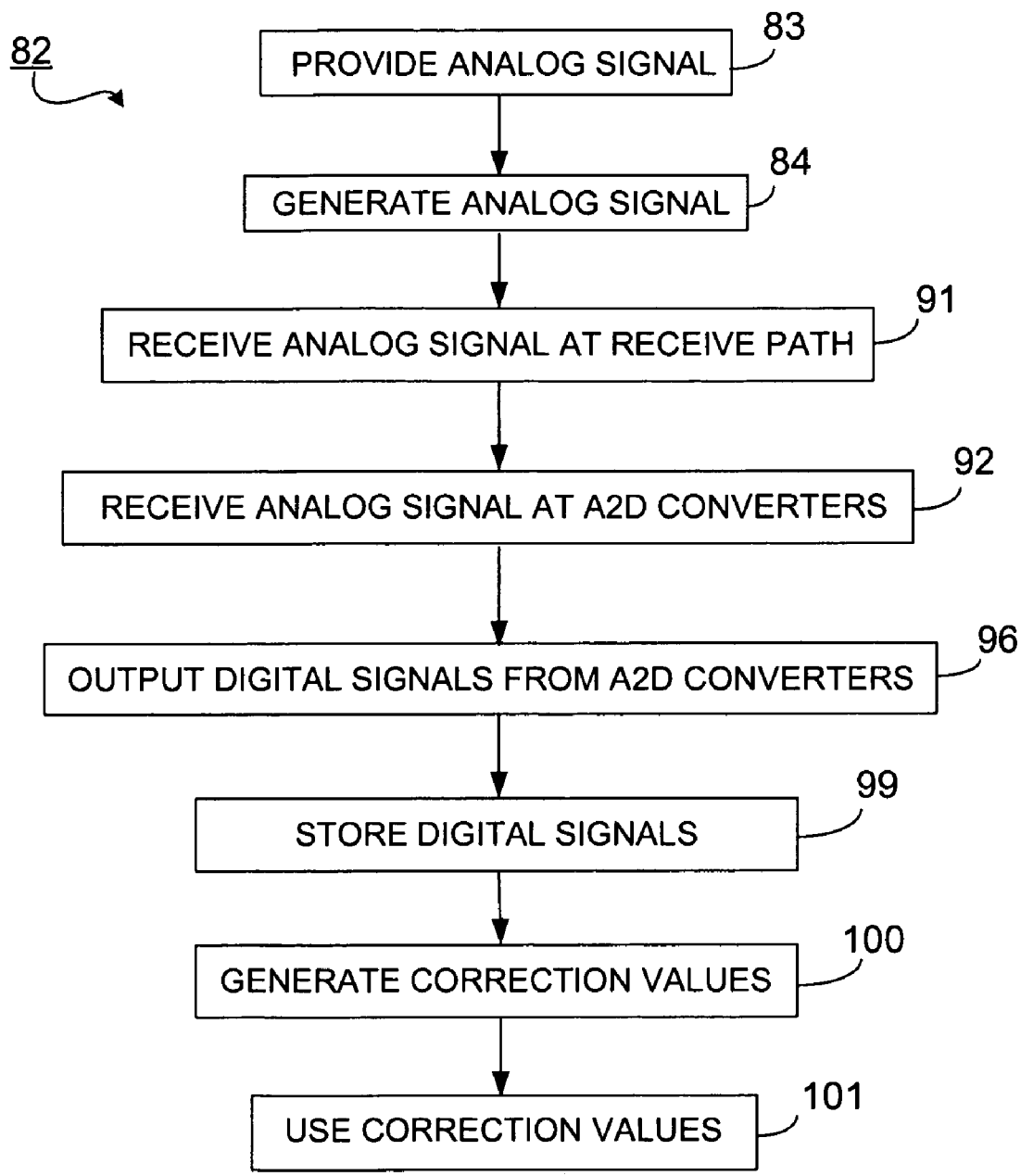
FIG. 2 is a flowchart showing a process for calibrating an interleaved converter system using multi-tone analog signals.

The correction values stored in LUT 20 are obtained via a calibration process. The calibration process involves sampling various multi-tone signals, and obtaining correction values for the multi-tone signals. The correction values are then stored in LUT 41 and used, as described above, to reduce image and offset spurs in output signals. FIG. 2 depicts the calibration process, and FIG. 3 shows circuitry therefor.

Figure 3:
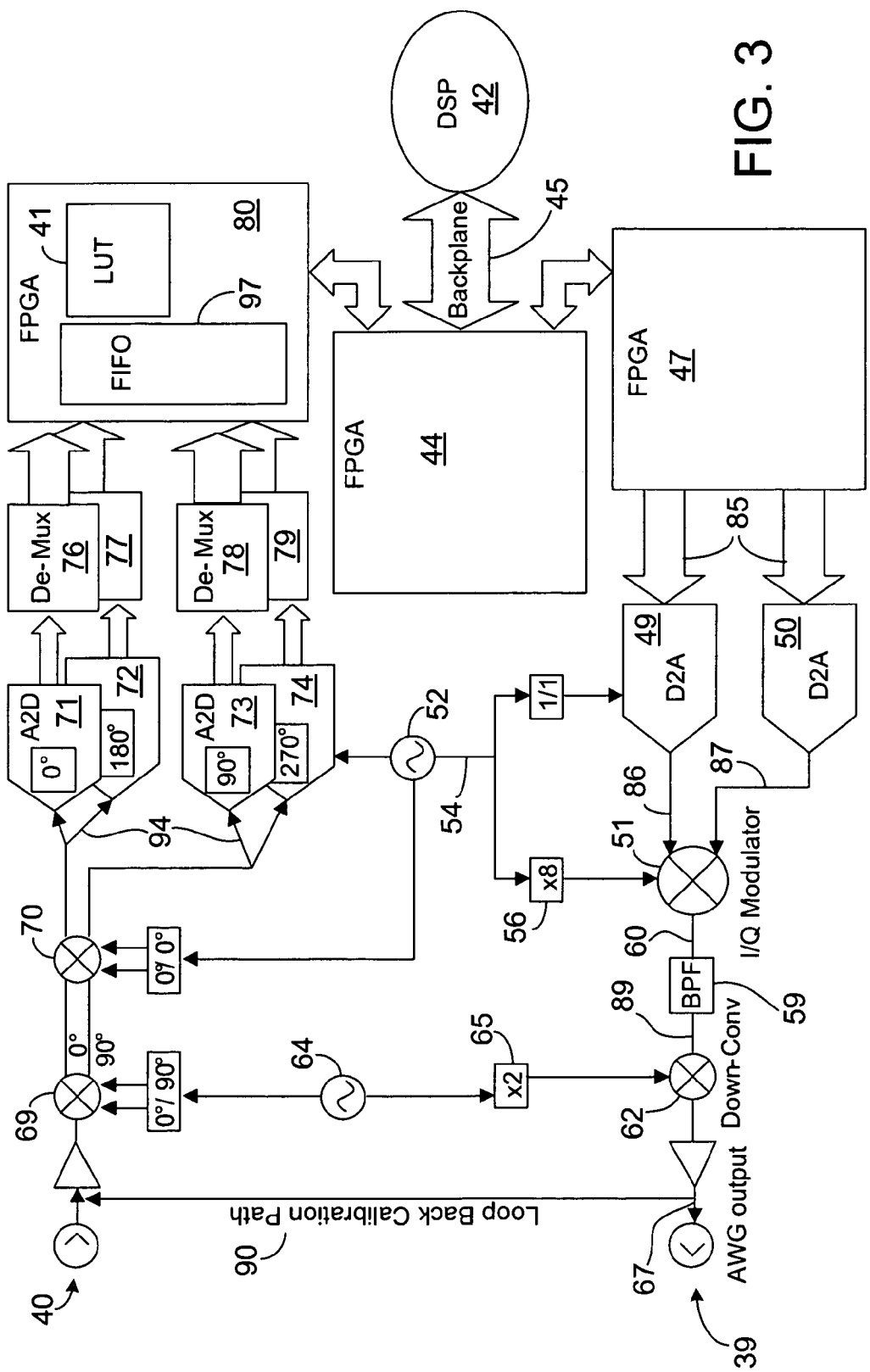
FIG. 3 is a block diagram of circuitry that may be used with the FIG. 2 process.

FIG. 3 shows two paths: a transmit path 39 and a receive path 40. Transmit path 39 implements an advanced waveform generator (AWG) to generate analog signals from an original digital signal, and to provide those analog signals to receive path 40. Receive path 40 receives the analog signals, digitizes the analog signals, and provides the resulting digital signals to a DSP. The DSP compares the resulting digital signals to the original digital signal. The difference between those signals corresponds to the correction values that are logically stored in LUT 41. A description of the circuitry shown in FIG. 3 is set forth below, followed by a description of the calibration process of FIG. 2.

The circuitry of FIG. 3 may be implemented on ATE, or all or part of the circuitry may be implemented off of the ATE. In FIG. 3, both transmit path 39 and receive path 40 include a processing device, such as a DSP 42, and an FPGA 44. DSP 42 communicates with FPGA 44 via a backplane 45 on the ATE. Transmit path 39 includes FPGA 47, digital-to-analog (D2A) converters 49, 50, and interphase/quadrature (I/Q) modulator 51. A clock source 52 generates a clock signal 54 that is applied to D2A converters 49, 50 and I/Q modulator 51. The frequency of clock signal 54 may be increased via a circuit element 56 between clock source 52 and I/Q modulator 51.

A bandpass filter (BPF) 59 receives output signal 60 of I/Q modulator 51 and applies that output to a down converter 62. Down-converter 62 translates the signal's carrier frequency from a high frequency to a lower frequency. A clock source 64 provides a clock signal to down converter 62. The frequency of the clock signal may be adjusted by circuit element 65. An analog signal (AWG output) 67 is output from transmit path 39 to receive path 40 in what is referred to as the "loop back calibration path".

Receive path 40 includes an I/Q demodulator 69 and an up-converter 70. I/Q demodulator 69 and up-converter 70 perform operations that are complementary to I/Q modulator 51 and down-converter 62, respectively. Clock sources 64 and 52 provide clocking signals to I/Q demodulator 69 and up-converter 70, as shown. Four interleaved A2D converters 71 to 74 are provided, the operation of which is similar to the operation of interleaved A2D converters 12 and 14. In this embodiment, interleaved converters 71 to 74 are each 90° out of phase. That is, A2D converter 71 samples at 0°; A2D converter 72 samples at 90°; A2D converter 73 samples at 180°; and A2D converter 74 samples at 270°.

Demultiplexers 76 to 79, each of which corresponds to an A2D converter, provide the A2D converter outputs to FPGA 80. In particular, demultiplexers 76 to 79 distribute the sampled, time-interleaved data to parallel pin inputs of FPGA 80. FPGA 80 is programmed to include the same circuitry as FPGA 15 (FIG. 1). Initially, however, LUT 41 in FPGA 80 is not programmed with correction values. The correction values are obtained by taking the difference of original and measured signals, and are stored logically in LUT 41, via calibration process 82 of FIG. 2. Thereafter, these correction values are used to reduce spurs in future signals in the manner described above with respect to FIG. 1.

Generally speaking, in calibration process 82, DSP 42 provides (83) an original digital signal, and transmit path 39 generates (84) an analog signal that is based on that original digital signal. In more detail, DSP 42 outputs the original digital signal to FPGA 44 via backplane 45. FPGA 44 interfaces backplane 45 to both transmit path 39 and receive path 40; and FPGA 47 interfaces FPGA 44 to transmit path 39. FPGA 47 receives the original digital signal from FPGA 44, and performs any necessary processing on the signal. FPGA 47 outputs original digital signal 85 to D2A converters 49, 50. The D2A converters generate analog signals 86, 87 that correspond to the original digital signal.

Analog signals 86, 87 are output from D2A converters 49, 50 to I/Q modulator 51, where they are combined and modulated to generate an analog signal 60 that corresponds to the original digital signal. Analog signal 60 is filtered by BPF 59 to limit its output to a specified frequency range. The frequency of analog signal 89 is reduced by down converter 62. The resulting analog signal 67 is output from transmit path 39 to loop back calibration path 90, from which analog signal 67 is obtained by receive path 40, as described below.

In this embodiment, transmit path 39 is configured to generate analog signals across the entire frequency band of A2D converters 71 to 74. For example, FPGA 47 may control the frequencies of the analog signals output by D2A converters 49, 50 based on instructions from DSP 42. The resulting analog signals, referred to herein as multi-tones, are used to determine correction values for various sampled frequencies of A2D converters 71 to 74. Different sampling frequencies require different correction values; hence the use of multi-tones at different frequencies. The different sampling frequencies require different correction values for LUT 41. By calibrating LUT 41 across the entire frequency band, a full set of correction values can be obtained. In this embodiment, sixty-one (61) multi-tones are used for calibration; however, any number of multi-tones may be used. In order to provide accurate correction values, the phases of the multi-tones should be aligned or offset (misaligned) by a predetermined amount, although this is not required. Post-processing may be performed in the DSP to compensate for offsets, noise, spurious signals (not resulting from offsets), and other factors.

Figure 4:
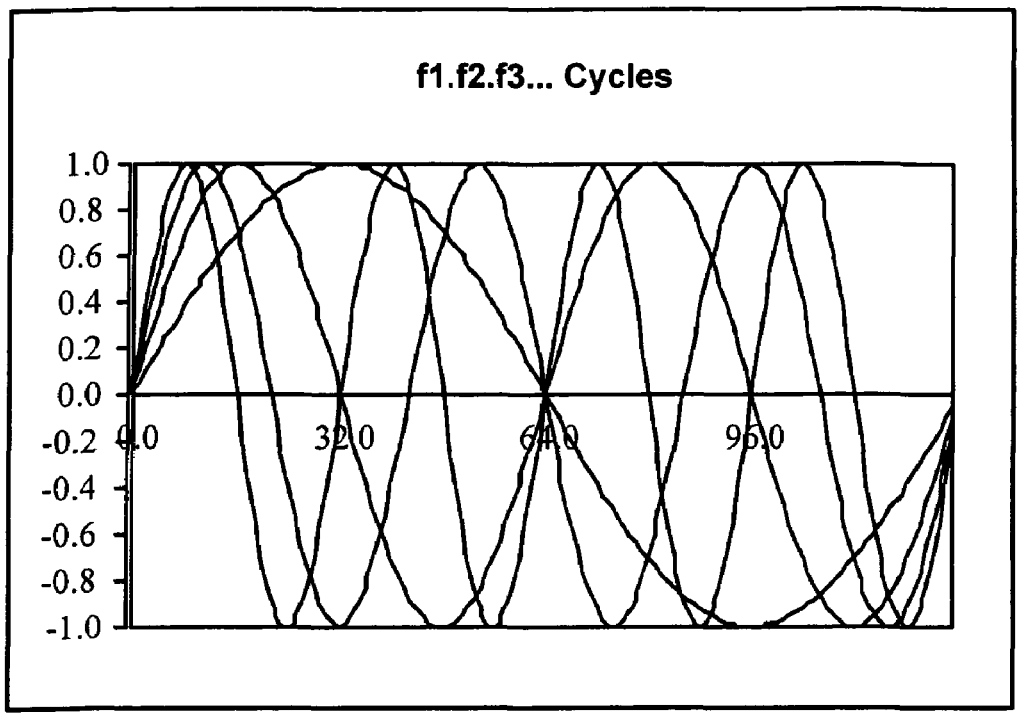
FIG. 4 is a graph showing phase-aligned multi-tones for use in calibration.
Figure 5:
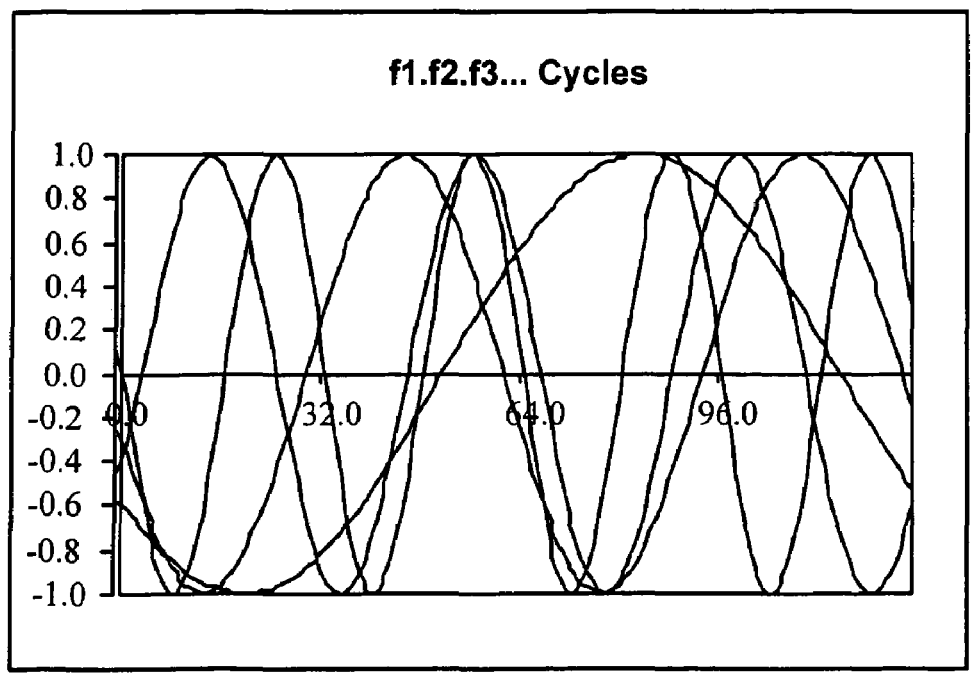
FIG. 5 is a graph showing phase misaligned multi-tones for use in calibration.

FIG. 4 shows an example of phase-aligned multi-tone signals that may be used in calibration process 82. FIG. 5 shows phase misaligned multi-tone signals.

Referring back to FIG. 3, in calibration process 82, analog signal 67 is received (91) at receive path 40, and subjected to demodulation by I/Q demodulator 69 and frequency up-conversion by up-converter 70. Interleaved A2D converters 71 to 74 receive (92) the resulting analog signal 94, and digitize analog signal 94.

In more detail, interleaved A2D converters 71 to 74 sample analog signal 94 at a sampling frequency that corresponds to a frequency of analog signal—the higher the frequency, the higher the sampling frequency. This sampling-frequency/signal frequency correlation may be programmed into the A2D converters. As was the case above, each A2D converter 71 to 74 samples analog signal 94 at a different time. For example, A2D converter 71 may sample analog signal 94 at a first time (T1); A2D converter 72 may sample analog signal 94 at a second time (T2); A2D converter 73 may sample analog signal 94 at a third time (T3); and A2D converter 74 may sample analog signal 94 at a fourth time (T4). The resulting digital signals 95 are output (96), demultiplexed by demultiplexers 76 to 79, and stored in FIFO buffer 97 on FPGA 80. There, the digital signals are stored (99) temporarily and resulting output signal (s) are provided to DSP 42.

During calibration process 82, there are no correction values stored in LUT 41. Therefore, an output signal, with spurs, is passed through FPGA 80 and FPGA 44 to DSP 42. Alternatively, the output signal may be processed and formatted for transmission to the DSP over the backplane. DSP 42 may also perform post-processing on the output signal, e.g., to compensate for misaligned phases or the like. In any case, DSP 42 ultimately has a version of the output signal from interleaved A2D converters 71 to 74. DSP 42 generates (100) correction values based on this output signal and the original digital signal. To do this, DSP 42 subtracts the original (ideal) digital signal from the output (measured) signal. The difference between these two signals equals the correction values.

DSP 42 stores the correction values in LUT 41, along with an indication of the frequency associated with those correction values. Thereafter, the correction values are used (101) to reduce spurs in future output signals, as described above. In this embodiment, calibration process 82 is repeated for each of the multi-tones provided by transmit path 39. As a result, LUT 41 stores correction values for the entire bandwidth supported by interleaved A2D converters 71 to 74. In alternate embodiments, calibration process 82 need not be performed for the entire frequency band supported by the A2D converters.

Calibration process 82 can be performed as needed to account for changes in hardware and/or software on ATE that includes the interleaved A2D converters.

It is noted that FIG. 1 shows only an exemplary structure for use in reducing spurs resulting from interleaved A2D converters. Any combination of hardware and/or software may be used to perform this function in the manner described above. The same is true for the calibration process 82 of FIG. 2 and the circuitry of FIG. 3.

In this regard, the processes described herein are not limited to use with the hardware and software described herein. All or part of the processes and circuitry described herein can be implemented using digital electronic circuitry, computer hardware, firmware, software, or some combination thereof.

The processes described herein can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the processes described herein can be performed by one or more programmable processors executing one or more computer programs to perform the functions of the processes. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. Other embodiments not specifically described herein are also within the scope of the following claims.

What is claimed is:

1. Automatic test equipment (ATE) comprising:
   interleaved analog-to-digital (A2D) converters to produce digital signals, the digital signals being used to produce an output signal, the output signal comprising a single signal that is a combination of the digital signals, the output signal having spurs;

a look-up table (LUT) to store correction values, the correction values for reducing the spurs in the output signal;

circuitry to apply the correction values to the output signal; and a processing device configured to calibrate the LUT prior to the circuitry applying the correction values to the output signal, the processing device calibrating the LUT by comparing test signals passed through the A2D converters to an original signal upon which the test signals were based.

2. The ATE of claim 1, wherein the spurs comprise at least one of image spurs and offset spurs, and the correction values substantially negate at least some of the spurs.

3. The ATE of claim 1, further comprising a buffer that receives the digital signals and that provides the output signal to the circuitry.

4. The ATE of claim 3, wherein the interleaved A2D converters comprise at least a first A2D converter and a second A2D converter, the first A2D converter producing a first digital signal and outputting the first digital signal to the buffer, and the second A2D converter producing a second digital signal and outputting the second digital signal to the buffer.

5. The ATE of claim 4, wherein the first A2D converter and the second A2D converter sample an input analog signal at different times to produce the first digital signal and the second digital signal, respectively.

6. The ATE of claim 1, further comprising programmable logic, wherein the LUT and the circuitry are part of the programmable logic.

7. The ATE of claim 1, wherein the circuitry comprises an element to combine the correction values and the output signal.

8. The ATE of claim 1, wherein the circuitry applies the correction values to the output signal to produce a corrected output signal; and wherein the processing device comprises a digital signal processor configured to receive the corrected output signal.

9. A system for calibrating automatic test equipment (ATE), the system comprising:

a processing device to provide a first digital signal;

a waveform generator to generate a first analog signal, the first analog signal being based on the first digital signal;

interleaved analog-to-digital (A2D) converters to receive a second analog signal, the second analog signal being based on the first analog signal, the interleaved A2D converters to produce second digital signals, the second digital signals being used to produce an output signal that is digital; and programmable logic to store a look-up table (LUT);

wherein the processing device is configured to receive a third digital signal that corresponds to the output signal, to generate correction values based on the third digital signal, and to store the correction values in the LUT.

10. The system of claim 9, wherein the processing device generates the correction values by comparing the third digital signal to the first digital signal, the correction values corresponding to a difference between the third digital signal and the first digital signal.

11. The system of claim 9, wherein the waveform generator comprises at least one digital-to-analog (D2A) converter and a bandpass filter that are used in producing the analog signal from the first digital signal.

12. The system of claim 9, wherein the output signal contains spurs, and the correction values are used to reduce spurs in future output signals that are based on outputs of interleaved A2D converters.

13. The system of claim 9, wherein the interleaved A2D converters comprise at least a first A2D converter and a second A2D converter, the first A2D converter producing one digital signal by sampling the second analog signal at one time, and the second A2D converter producing an other digital signal by sampling the second analog signal at another time, the one digital signal and the other digital signal comprising the second digital signals.

14. The system of claim 13, wherein the second analog signal comprises one of plural multi-tones, the multi-tones being across a frequency range of the interleaved A2D converters.

15. The system of claim 14, wherein the multi-tones are phase-aligned or phase-misaligned.

16. A method of calibrating automatic test equipment (ATE), the method comprising:

providing a first digital signal;

generating a first analog signal based on the first digital signal;

receiving, at interleaved analog-to-digital (A2D) converters, a second analog signal, the second analog signal being based on the first analog signal;

outputting, from the interleaved A2D converters, second digital signals, the second digital signals being used to produce an output signal that is digital; and generating correction values based on a third digital signal, the third digital signal corresponding to the output signal;

wherein the correction values are usable to adjust a future output signal that is based on outputs of interleaved A2D converters.

17. The method of claim 16, wherein generating the correction values comprises:

comparing the third digital signal to the first digital signal, the correction values corresponding to a difference between the third digital signal and the first digital signal.

18. The method of claim 16, wherein the second analog signal comprises one of plural multi-tones, the multi-tones being across a frequency range of the interleaved A2D converters that receive the second analog signal.

19. The method of claim 18, wherein the multi-tones are phase-aligned or phase-misaligned.

20. The method of claim 16, further comprising:

using the correction values to adjust the future output signal by combining the correction values with the future output signal to reduce spurs in the future output signal.

21. Automatic test equipment (ATE) comprising:

interleaved analog-to-digital (A2D) converters to produce digital signals, the digital signals being used to produce an output signal, the output signal having spurs;

a buffer to receive the digital signals and to provide the output signal;

a look-up table (LUT) to store correction values, the correction values for reducing the spurs in the output signal;

circuitry to apply the correction values to the output and a processing device configured to calibrate the LUT prior to the circuitry applying the correction values to the output signal, the processing device calibrating the LUT by comparing test signals passed through the A2D converters to an original signal upon which the test signals were based.

22. The ATE of claim 21, wherein the spurs comprise at least one of image spurs and offset spurs, and the correction values substantially negate at least some of the spurs.

23. The ATE of claim 22, wherein the interleaved A2D converters comprise at least a first A2D converter and a second A2D converter, the first A2D converter producing a first digital signal and outputting the first digital signal to the buffer, and the second A2D converter producing a second digital signal and outputting the second digital signal to the buffer.

24. The ATE of claim 23, wherein the first A2D converter and the second A2D converter sample an input analog signal at different times to produce the first digital signal and the second digital signal, respectively.

25. The ATE of claim 21, further comprising programmable logic, wherein the LUT and the circuitry are part of the programmable logic.

26. The ATE of claim 21, wherein the circuitry comprises an element to combine the correction values and the output signal.

27. The ATE of claim 21, wherein the circuitry applies the correction values to the output signal to produce a corrected output signal; and wherein the processing device comprises a digital signal processor configured to receive the corrected output signal.

* * * * *

UNITED STATES PATENT AND TRADEMARK OFFICE
CERTIFICATE OF CORRECTION

PATENT NO. : 7,183,953 B2  
APPLICATION NO. : 11/094896  
DATED : February 27, 2007  
INVENTOR(S) : Toshihide Kadota It is certified that error appears in the above-identified patent and that said Letters Patent is hereby corrected as shown below:

Column 10, Claim 21, Line 64;  
Insert --signal;-- after the word "ouput"

Signed and Sealed this

First Day of May, 2007

JON W. DUDAS  
*Director of the United States Patent and Trademark Office*